United States Patent
Mori et al.

(10) Patent No.: US 6,791,029 B2
(45) Date of Patent: Sep. 14, 2004

(54) ELECTRONIC APPLIANCE HAVING HOUSING-CASE MADE OF BIODEGRADABLE MATERIAL, AND CONTAINER MADE OF BIODEGRADABLE MATERIAL

(75) Inventors: Hiroyuki Mori, Kanagawa (JP); Ritsuko Inoue, Kanagawa (JP); Kazuki Satake, Kanagawa (JP); Miyuki Kamei, Kanagawa (JP); Yuko Fujihira, Kanagawa (JP); Tsutomu Noguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/289,026

(22) Filed: Nov. 6, 2002

(65) Prior Publication Data

US 2003/0056966 A1 Mar. 27, 2003

Related U.S. Application Data

(62) Division of application No. 09/741,621, filed on Dec. 19, 2000, now Pat. No. 6,512,174.

(30) Foreign Application Priority Data

Dec. 20, 1999 (JP) .......................................... P11-361336
Mar. 14, 2000 (JP) ....................................... P2000-070897

(51) Int. Cl.$^7$ ............................. H05K 5/00; H02G 3/08
(52) U.S. Cl. ........................ 174/52.1; 361/752; 361/757
(58) Field of Search ................................ 174/52.1, 52.4, 174/50, 52.3; 257/678; 361/600, 752, 757

(56) References Cited

U.S. PATENT DOCUMENTS

| 5,821,327 A | * | 10/1998 | Oota et al. ................... 528/354 |
| 6,114,944 A | * | 9/2000 | Kosmidis ..................... 338/200 |
| 6,456,497 B1 | * | 9/2002 | Palmer ....................... 361/752 |
| 2003/0132302 A1 | * | 7/2003 | Hattori ....................... 235/492 |
| 2003/0234294 A1 | * | 12/2003 | Uchihiro et al. ............ 235/492 |

FOREIGN PATENT DOCUMENTS

JP            405342903 A   *  12/1993

* cited by examiner

Primary Examiner—Hung V. Ngo
(74) Attorney, Agent, or Firm—Sonnenschein, Nath & Rosenthal LLP

(57) ABSTRACT

An appliance comprising a housing-case, a main unit of such appliance and an optional structural member, wherein at least portions of the housing-case and the structural member are made of biodegradable material containing polylactic acid as a major component is provided. Such appliance can achieve durability sufficient for the practical use without causing environmental impact if the housing-case and structural member thereof are disposed as they are.

5 Claims, 7 Drawing Sheets

FIG. 1

| SOURCE RESIN | HOT WATER DROP | HOT WATER IMMERSION (10 SEC) | 60 °C, RH 80 % FOR 24 HOURS |
|---|---|---|---|
| POLYLACTIC ACID A | UNAFFECTED | SLIGHTLY WHITENED AT 100 °C | UNAFFECTED |
| POLYLACTIC ACID B | UNAFFECTED | DEFORMED AT 90 °C | UNAFFECTED |
| POLYHYDROXY BUTYRATE + POLYHYDROXY VALERATE | DEFORMED | DEFORMED AT 80 °C | UNAFFECTED |
| POLYBUTYLENE SUCCINATE | DEFORMED, PARTIALLY WHITENED | DEFORMED AT 80 °C | UNAFFECTED |
| POLYCAPROLACTONE | DEFORMED | DEFORMED AT 60 °C | UNAFFECTED |

FIG. 2A
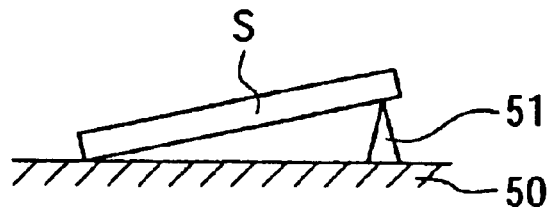
FIG. 2B
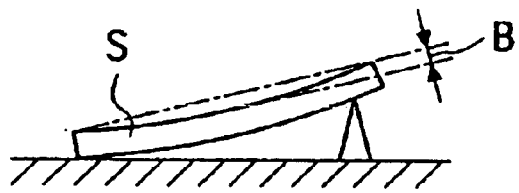
FIG. 3
| DISLOCATION B | |
|---|---|
| SOURCE RESIN | CONDITION 80 °C, 24HOURS |
| POLYLACTIC ACID A | 1.0 mm |
| POLYLACTIC ACID B | 0.1 mm |
| POLYLACTIC ACID C | 0.2 mm |

FIG. 4

| SOURCE RESIN | TOUCH OF CLICK | DURABILITY TEST | WHITENING BY BENDING (REFERENCE) |
|---|---|---|---|
| POLYLACTEC ACID A | GOOD | FINE SCRATCHES FOUND IN THE CENTER AREA | RELATIVELY QUIET |
| POLYLACTIC ACID B | GOOD | FINE SCRATCHES FOUND IN THE CENTER AREA | RELATIVELY QUIET |
| POLYHYDROXY BUTYRATE + POLYHYDROXY VALERATE | GOOD | DIMPLE UNRESTORABLE (AFTER PRESSED CA. 600 TIMES) | REMARKABLE IN A SINGLE DIRECTION |
| POLYBUTYLENE SUCCINATE | NO GOOD (TOO SOFT) | — | MINUTE BUT REMARKABLE |
| POLYCAPROLACTONE | NO GOOD (TOO SOFT) | — | NOT REMARKABLE |

FIG. 5

| SOURCE RESIN | VISIBLE WAVELENGTH REGION (380~770 nm) | INFRARED (900 nm) |
|---|---|---|
| POLYLACTIC ACID A | 89~93 | 93 |
| POLYLACTIC ACID B | 82~87 | 88 |
| POLYHYDROXY BUTYRATE + POLYHYDROXY VALERATE | 37~74 | 77 |
| POLYBUTYLENE SUCCINATE | 10~28 | 22 |
| POLYCAPROLACTONE | 4~8 | 9 |

| WEIGHT RATIO BINDER/CARBON | FILM PROPERTY |
|---|---|
| 1 / 10 | STRONG |
| 1 / 12 | STRONG |
| 1 / 15 | STRONG |
| 1 / 17 | SLIGHTLY FRAGILE |
| 1 / 20 | VERY FRAGILE |

ELECTRONIC APPLIANCE HAVING HOUSING-CASE MADE OF BIODEGRADABLE MATERIAL, AND CONTAINER MADE OF BIODEGRADABLE MATERIAL

RELATED APPLICATION DATA

The present application claims priority to Japanese Application Nos. P11-361336, filed Dec. 20, 1999 and P2000-070897, filed Mar. 14, 2000, and is a divisional of U.S. application Ser. No. 09/741,621, filed Dec. 19, 2000, Now U.S. Pat. No. 6,512,174, all of which are incorporated herein by reference to the extent permitted by law.

BACKGROUND OF THE INVENTION

1. Field of the Invention

The present invention relates to an electronic appliance using a housing-case and inner structural members, wherein at least portions of such housing-case and inner structural members are made of biodegradable material and the present invention further relates to a container made of such biodegradable material.

2. Description of the Related Art

For example, electronic appliances are generally put into use for several to ten-odd years and disposed thereafter as refuses. At present, such refuses, except those of some large-sized electronic appliances, are not collected nor recycled. In Japan, recycling of the used alliance is not legally regulated. Thus the most of the electronic appliances becomes non-combustible refuses after once they are disposed. Even small-sized electronic appliances can be a large amount of refuses if the marketing volume thereof is huge. This raises a serious problem when considering the recent shortage in the number (or the capacity) of waste disposal sites.

Incidentally, when the appliances are disposed, a shredding process is applied as the most popular way of a waste treatment to the wasted appliances. The shredding process, however, cannot provide a fundamental solution for the problem, since such waste treatment method can only reduce the volume of the refuses, and the refuses will remain intact for tens and hundreds of years if submitted to landfill. If the shredded dust should be recycled as resources, every parts are finely crashed, and thus even a valuable material such as gold and copper can be mixed with invaluable materials such as resin, which results in degraded purity of materials to be recycled and a poor efficiency in the recovery.

SUMMARY OF THE INVENTION

It is therefore a primary object of the present invention to provide an appliance using a housing-case and inner structural members, wherein at least portions of such housing-case and inner structural members are made of biodegradable material, and further this invention relates to a container made of such biodegradable material, because the biodegradable material is not causative of environmental impact even if disposed without any treatment after use.

According to the present invention, at least portions of a structure of an appliance housed in a housing-case and further a container are made of biodegradable material, wherein the thermally deformable temperature [defined in JIS (Japanese Industrial Standard) K7207] of the biodegradable material is preferably above 50° C. The biodegradable material is such a material capable of being degraded through the biologic metabolism.

In this specification, the housing-case means a case for housing an appliance such as an electronic appliance and a member which forms a part of a surface of the appliance, and the structural member means a member to keep the strength of the appliance housed in the housing-case. The container means a case to contain a small part such as a cassette tape, a magnetic disc, etc, and further electronic appliances. The electronic appliance includes such as a remote commander and any electronic appliance including circuit boards, a drive device, etc.

In an appliance according to a first embodiment of the present invention, it is preferable that at least almost all of top surface of a housing-case for an appliance are made of biodegradable material and further the melt-flow-rate [defined in JIS (Japanese Industrial Standard) K7207] of such biodegradable material is preferably within 6 to 12.

In an appliance according to a second embodiment of the present invention, the appliance comprises a housing-case, a main unit of the appliance and an optional structural member, wherein at least portions of the housing-case and the structural member are made of biodegradable material, and the portion of the biodegradable material and the portion of non-biodegradable material of the appliance are assembled to be easily separated from each other upon disposal.

In the appliance according to the second embodiment of the present invention, the thermally deformable temperature [defined in JIS (Japanese Industrial Standard) K7207] of the biodegradable material is preferably above 50° C.

In an appliance according to a third embodiment of the present invention, the appliance is, for example, a remote commander comprising a printed circuit board and a housing-case to hold the printed circuit board inside. The remote commander is used to control another electronic appliance placed at a remote location by emitting a control infra-red right. In this case, a light emitting portion of the housing-case is made of light transmissive biodegradable material and the other portion of the housing-case is made of impact resistive biodegradable material. The thermally deformable temperature of these biodegradable material is preferably above 50° C.

In an appliance according to a forth embodiment of the present invention, a sheet-like panel having buttons formed on its surface by a press forming process is provided as a part of a housing-case of the appliance, wherein the sheet-like panel is made of the biodegradable material.

In the appliance according to the forth embodiment of the present invention, the thermally deformable temperature of the biodegradable material for the sheet-like panel is preferably above 50° C., and a conductive film including binder made of the biodegradable material and conductive material is preferably formed on a back surface of each button. The binder is also made of the biodegradable material of polyester system and a melting point of the biodegradable material for the binder is preferably lower than that of the biodegradable material for the panel.

In an electronic appliance according to a fifth embodiment of the present invention, the appliance has a housing-case comprising a sheet-like panel and a case and both the panel and the case are made of biodegradable material and fixed to each other by adhesive made of biodegradable material. Preferably each of above described biodegradable material has the thermally deformable temperature of higher than 50° C.

In an appliance according to a sixth embodiment of the present invention, the appliance comprises a housing-case, a main unit of the appliance and an optional structural member, wherein at least portions of the housing-case and the structural members are made of biodegradable material containing polylactic acid as a major component.

The biodegradable material containing polylactic acid as a major component is a mixture of polylactic acid and the other components, wherein a weight for the other components preferably does not exceed 50% of the total weight. The above mentioned other components preferably comprise a single or a plurality of materials arbitrarily selected from a group consisting of biodegradable organic compound other than polylactic acid and inorganic compound (magnesium hydroxide, talc, carbon, iron oxide, etc).

The organic compound other than polylactic acid is a single or a plurality of materials arbitrarily selected from a group consisting of polybutylene succinate, polycaprolactone, aliphatic polyester (polyhydlactic acid, for example), cellulose acetate-base biodegradable resin, polyvinyl alcohol and natural organic substances (paper, pulp, natural rubber, glue, lacquer, etc.). Preferably the biodegradable material includes only polylactic acid, and the process for disposal becomes more easy and thereby environmental pollution by the disposal is easily avoided.

In the appliance of the present invention, the main unit of the appliance is fixed in the housing-case by screwing, fitting, or adhesion using adhesive so as to allow easy separation of the housing-case from the main unit of the appliance, so that it can readily be separated into the biodegradable members and the non-biodegradable members. In the appliance of the present invention, the push buttons for operating the appliance are provided on the surface of the housing-case, and these push buttons are preferably made of the biodegradable material containing polylactic acid as a major component.

A container according to a seventh embodiment of the present invention, at least a part of the container is made of biodegradable material containing polylactic acid as a major component.

The container of this invention and the appliance of the present invention are preferably constructed as follows.

1) The biodegradable material containing polylactic acid as a major component is a mixture of polylactic acid and other component, wherein a weight of the other component preferably does not exceed 50% of the total weight.

2) The above mentioned other component comprises a single or a plurality of materials arbitrarily selected from a group consisting of biodegradable organic compound other than polylactic acid and inorganic compound (magnesium hydroxide, talc, carbon, iron oxide, etc.).

3) The organic compound other than polylactic acid is a single or a plurality of materials arbitrarily selected from a group consisting of polybutylene succinate, polycaprolactone, aliphatic polyester (polyhydlactic acid, for example), cellulose acetate-base biodegradable resin, polyvinyl alcohol and natural organic substances (paper, pulp, natural rubber, glue, lacquer, etc.).

4) The biodegradable material containing polylactic acid as a major component is composed only of polylactic acid.

5) The main unit of the appliance is fixed to the housing-case by screwing, fitting, or adhesion using an adhesive so as to be easily separated from the housing-case.

6) The container is transparent or semi-transparent in some case.

7) When a movable cover is provided, decomposition or disassembling of the housing-case or the container will become more easy by supporting the movable cover with a pivot bearing in a rotatable manner so as to allow the cover to turn around the pivot bearing and to be fitted to the housing-case or the container to close it.

BRIEF DESCRIPTION OF THE DRAWINGS

In the accompanying drawings:

FIG. 1 is a table showing test results of heat resistance and moisture resistance of sheets made of various biodegradable materials;

FIGS. 2A and 2B are charts showing a method for measuring bending characteristics of a test sample;

FIG. 3 is a table showing test results of bending characteristics based on the method as shown in FIGS. 2A and 2B;

FIG. 4 is a table showing test results of touch of click and durability of circular projections fabricated from the above sheets and used as push buttons;

FIG. 5 is a table showing measurement results of light transmissivity of the individual materials;

DESCRIPTION OF THE PREFERRED EMBODIMENT

Figure 6:
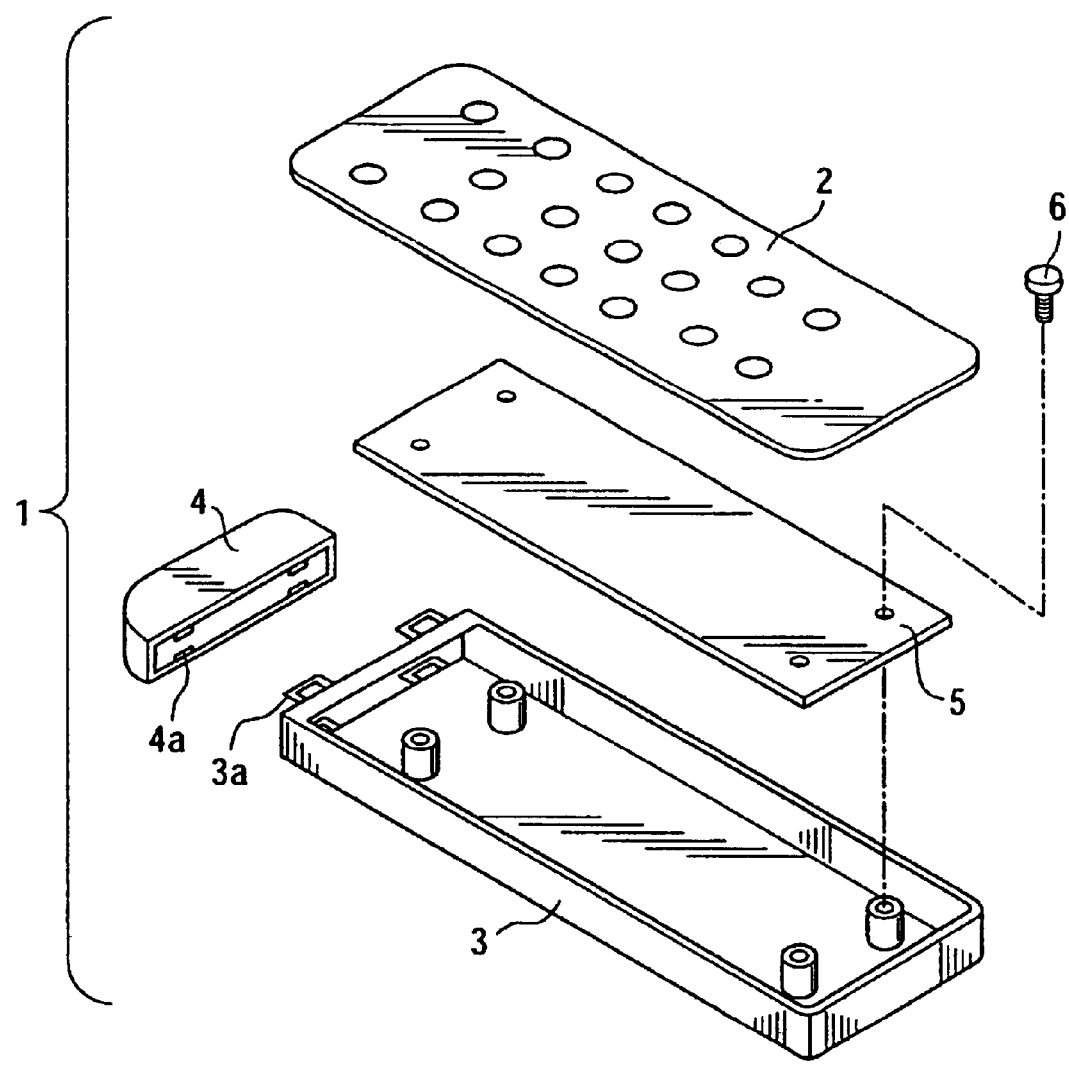
FIG. 6 is an exploded perspective view of a remote commander of one of embodiments of the present invention.

In accordance with the present invention, a housing-case of an appliance, optional structural members of the appliance, and a container for an appliance are made of biodegradable material. If possible, it is, of course, the best way to use the biodegradable material to all of the housing-case, the optional structural members and other parts of the appliance. But it is practically very difficult to make all members and electronic parts with the biodegradable material, technically.

Accordingly, the housing-case occupying major part of the appliance and the container for an appliance, for example, are preferably made of the biodegradable material containing polylactic acid as a major component. In assembling the appliance and the container, those housing-case and the container are so constructed that the biodegradable material and the non-biodegradable material of those housing-case and the container are easily separated from each other upon disposal. Accordingly, the biodegradable material and non-biodegradable material of the appliance and the housing-case can be easily processed for a recycling process.

Further in the appliance such as an electronic appliance of the present invention, the housing-case and the top surface of the structural member are preferably made of the biodegradable material. Namely, at least the top surface of the housing-case and/or the structural member of the electronic appliance such as a radio, a microphone, a portable TV, a keyboard, a head-phone stereo, a telephone, a cassette-radio, an earphone, etc are made of the biodegradable material. In one case, the biodegradable material may be coated or sprayed on the top surface of the housing-case of the electronic appliance. Namely, in the electronic appliance, the top surface of the housing-case is formed as a layered structure having much biodegradable material than inner part of the housing-case. As the biodegradable material is harmless to human body than conventional resin material, the electronic appliance having the housing-case covered with the biodegradable material becomes more safe than conventional appliances.

In order to use the biodegradable material as the housing-case and the structural member of the electronic appliance, following specifications are required for the biodegradable material. Namely, the thermally deformable temperature of the biodegradable material is preferably above 50° C. Further the melt-flow-rate of the biodegradable material is preferably within 6 to 12 in consideration of easiness for a mold-forming process. Further it is desirable that the biodegradable material does not change the physical property after being placed in an atmosphere of 60° C. in temperature and 80% in humidity during 24 hours.

In the appliance and the container of the present invention, the biodegradable material containing polylactic acid as a major component may be a mixture of polylactic acid and other component, and the other component may be a single or a plurality of additives arbitrarily selected from a group consisting of lubricant, flame retardation providing agent, flame retarder, ultra-violet absorber, antioxidant, coloring agent, antistatic agent, sound insulation providing agent, heat resistance providing agent, abrasion resistance providing agent, and reinforcing fiber.

Specific examples of the additives are shown below:

(1) lubricant such as zinc stearate and butyl stearate;
(2) flame retardation providing agent such as talc;
(3) flame retarder such as magnesium hydroxide and aluminum hydroxide;
(4) ultraviolet absorber such as phenyl salicylate;
(5) antioxidant such as 1,1,3-tris (2-methyl-4-hydroxy-5-t-buthylphenyl) butane;
(6) coloring agent such as inorganic pigment, organic pigment and dye;
(7) antistatic agent such as alkylimidazoline;
(8) sound insulation providing agent such as iron oxide;
(9) heat resistance providing agent such as talc;
(10) abrasion resistance providing agent such as graphite; and
(11) reinforcing fiber such as inorganic high-strength fiber and organic high-strength fiber.

The construction of the present invention is explained with reference to test results and various embodiments as follows.

Of course certain levels of characteristics and physical properties are required for the housing-case of the appliance and the container of the present invention since material characteristics individually required for the housing-case or the container thereof are already defined. Thus the inventors of this invention examined to find out biodegradable materials suitable for use in the housing-case for appliances, structural members and containers for containing appliances, cassette tapes, discs, etc.

FIG. 1 shows test results of heat resistance and moisture resistance of sheets of 0.1 mm thick made of various biodegradable materials (biodegradable resin). As for polylactic acid, two products (A and B) obtained from different manufacturers were used, both of which proved superior heat resistance and moisture resistance than the other materials as shown in FIG. 1.

The bending characteristics of sheets were measured as deterioration of physical property after the heating. As shown in FIG. 2A, a rectangular test sample S having dimension such as 7 (width)×50 (length)×2 (thickness) mm, for example, was placed on a test desk 50. One end of the test sample S was directly placed on the test desk 50 and the other end of the test sample S was placed on the test desk 50 by way of a support member 51 having a height of 15 mm. The test sample S was placed in an atmosphere of 80° C. in temperature and a humidity-free in humidity during 24 hours together with the test desk. After taking out the test sample from the above mentioned atmosphere, a dislocation B (as shown in FIG. 2B) of the test sample S was measured, and the dislocation B was defined as the bending characteristics.

FIG. 3 shows test results of the bending characteristics for three types (A, B and C) of source resin. A source material for the housing-case and the container preferably have to show the dislocation B below 1.0 mm in the bending characteristics.

FIG. 4 shows test results of touch of click and durability of circular projections of 7 mm in diameter and 0.5 mm in height, fabricated by press forming the above sheets and used as push buttons. The reason why the above tests were conducted is that the sheet materials are often fabricated into such form composing the surface of electronic appliances and used as push buttons. The test results revealed that polylactic acid have rigidity in an appropriate range and also have desirable durability.

FIG. 5 shows measurement results of light transmissivity of the individual materials. When these materials are intended for use in appliances, it is necessary to confirm not only the transparency in the visible wavelength region but also the transmissivity at 900 nm or around to allow communication in the infrared wavelength region. As clearly known from the FIG. 5, the polylactic acid showed high transmissivity in both wavelength regions.

While other physical properties such as impact resistance, tensile strength and formability need be considered, these can readily be obtained by various known information sources such as material data sheets distributed by manufacturers of such resins, and from which superiority of the polylactic acid can readily be confirmed. Since the polylactic acid was thus found to be excellent in every physical properties, the present inventors then used these materials to make prototypes.

Next, the present invention embodied as a remote commander will be explained. FIG. 6 is an exploded perspective view showing an overall structure of the remote commander for television sets, video tape recorder or the like. The remote commander 1 comprises a sheet-type panel 2, a case 3, a filter 4, a mounting board or printed circuit board 5 and screws 6 for fixing the mounting board 5 to the case 3. The panel 2 and the case 3 together constitutes a housing-case, and the filter 4 also serves as a structural member. The panel 2, the case 3 and the filter 4 are made of biodegradable resin containing polylactic acid as a major component. The filter 4 is fixed to the case 3 by engaging projected portions 4a thereof with hole portions 3a provided on the case 3. The mounting board 5 is fixed to the case 3 by means of the screws 6 as described before. The panel 2 is fixed to the mounting board 5 with the aid of adhesive coated on the rear surface of the panel 2 so as to allow easy peel-off from the mounting board 5.

When the remote commander 1 is to be disposed, at first the panel 2 is peeled off from the mounting board 5, the filter 4 is disengaged from the case 3, and then the screws 6 are loosen to separate the housing-case members (the panel 2 and the case 3) made of the biodegradable resin and the mounting board 5 made of non-biodegradable material. The total volume of the housing-case is approx. 3 times larger than that of the mounting board 5 in general, so that fabricating the entire part of the housing-case with the biodegradable resin can suppress the volume of parts to be recycled as small as ¼ of that of the conventional remote commander.

The method for fabricating parts of the remote commander 1 is explained next. The case 3 and the filter 4 are formed by an injection molding process. In this case, impact resistive source resin is used to the case 3 and light transmissive source resin is used to the filter 4, because the infra-red light emitted from inside of the remote commander 1 has to transmit the infra-red light through the filter 4. To be more concrete, talc or magnesium hydroxide is add to polylactic acid for reinforcing impact resistivity of the source resin for the case 3, and pure polylactic acid are used to add to the source resin for the filter 4. Further in order to put black color to the case 3, carbon black (powder) is added to the polylactic acid. As coloring agent, iron oxide other than the carbon black is preferable because those materials do not yield environmental pollution after the biologic metabolism.

Figures 7, 8:
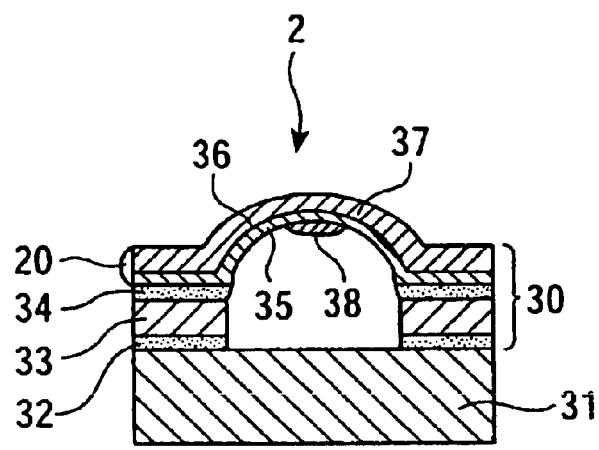
FIG. 7 is a sectional view of one of embodiments of a laminated structure of a push button.
FIG. 8 is a table showing film property of a film with regard to weight % ratio of binder and carbon.

Further a construction of the panel 2 is explained more detail with reference to FIG. 7, wherein the figure shows a sectional view of the panel, and particularly a laminated structure of a push button as a main part of the panel 2. Namely the panel 2 comprises a dome-shaped push button 30 and a substrate 31 supporting the push button 30 fixed by adhesive 32. The adhesive 32 is preferably made of a mixture of natural resin and latex of natural rubber.

The push button 30 comprises a spacer 33 made of polybutylene succinate having a thickness of 125 μm and a button body 20 laminated on the spacer 33 by adhesive 34. The adhesive 34 is also made of a mixture of natural resin and latex of natural rubber.

In this button body 20, an outer-most layer 37 is a polylactic acid film (a sheet made by a 2-axis drawing process) having a thickness of 100 μm. A printed layer 36 is formed by printing acryl-base resin using a screen printing process on a back side of the outer-most layer 37 and further a laminate film 35 of polybutylene succinate having a thickness of 20 μm and a conductive film 38 are laminated in this order on the printed layer 36. The conductive film 38 is made of carbon black added polybutylene succinate and the printing layer 36 has printed displays for the operation of the remote commander by the screen printing process. The laminate film 35 serves to protect the printing layer 36.

According to this embodiment as described above, polylactic acid is used as a material for the outer-most layer 37, and polybutylene succinate having lower thermally deformable temperature than that of the polylactic acid is used as not only a material for the laminate film 35 but also a binder for the conductive film 38. Accordingly when the dome-shaped member for the push button is formed by pressing the polylactic acid, simultaneously films such as the conductive film 38 are able to be thermally fixed. In this case, the temperature for the press process is preferably set to be 80° C. to 100° C., where the polylactic acid does not thermally deformed and the polybutylene succinate thermally deforms enough to attain the above mentioned thermal-fixing.

In addition, in the above mentioned conductive film 38, the carbon black is used as the conductive material, so that the pollution problem can be avoided if the conductive film 38 is organically metabolized together with the panel 2. In this embodiment, the polybutylene succinate is used as the binder, but other biodegradable material such as polylactic acid can be employed. Further in case of fabricating the conductive film 38, after making an emulsion by mixing and dispersing powder of carbon black in the solution of polybutylene succinate resin dissolved chloroform, the emulsion was painted on a glass plate to have a painted film having a proper thickness. Thus the conductive film 38 was obtained by peeling off the painted film from the glass plate after a drying process.

The relation of the weight % of the polybutylene succinate as the binder and the carbon black powder relative to the film property is shown in FIG. 8.

According to the embodiment of this invention, the weight % for the binder and the carbon was preferably selected to be ⅕. further a thickness of the conductive film 38 was preferably set to be 90 μm to 140 μm. And an ohmic value of the conductive film 38 was set to be 70 Ω/cm to 100 Ω/cm.

In the above described example, the mixture of natural resin and latex of natural rubber was applied to the above mentioned adhesives 32 and 34, but in stead of these, polylactic acid, aliphatic polyester such as polybutylene succinate, polycaprolactone and polyhydlactic acid, cellulose acetate-base biodegradable resin and polyvinyl alcohol can be used as a biodegradable adhesive. Further as a source material for the adhesive, molecular-weight reduced high polymeric material such as used as a panel or a sheet can be used. Further blended natural material such as natural rubber and polylactic acid is also can be used as adhesive material, and if the material for the adhesive is aliphatic polyester having a melting point of less than 100° C., it can be used as hot melt adhesive, solution adhesive or solvent adhesive.

In the panel 2 in FIG. 7, all of constructing members such as the adhesive 32, the spacer 33, the adhesive 34, the laminate film 35 the outer-most layer 37 and the binder for the conductive film 38 are made of the biodegradable materials, except the substrate 31 and the printed layer 36.

Figure 9:
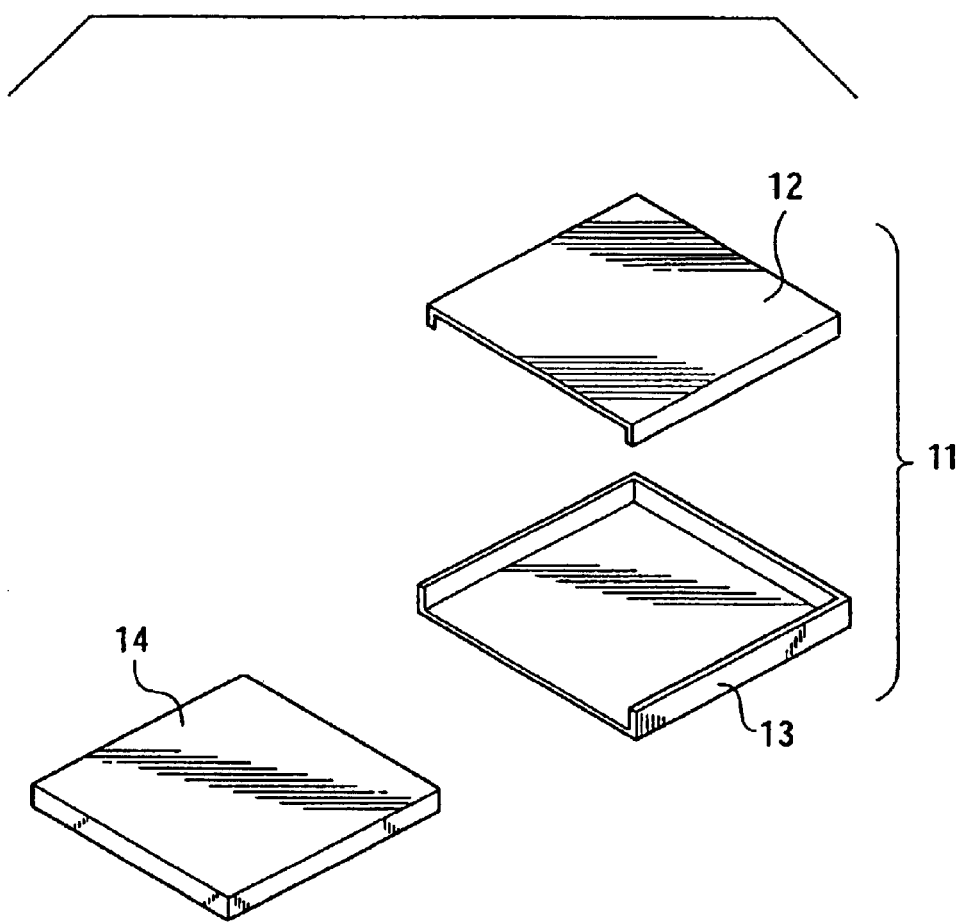
FIG. 9 is an exploded perspective view of a sleeve-type case for a Mini Disc player of another embodiment of the present invention.

Next, the present invention embodied as a container for carrying various parts will be explained. FIG. 9 is an exploded perspective view of a container 11 for carrying a Mini Disc (Trade Mark) 14 for recording music. The container 11 comprises only of an upper case 12 and a lower case 13. Thus the entire body of the container 11 can be made of the biodegradable resin containing polylactic acid as a major component. While the container 11 may sometimes be disposed with the Mini Disc 14 housed therein, the Mini Disc 14 and the container 11 can readily be separated.

What is claimed is:

1. A handheld remote comprising a housing and circuitry configured for wireless communication within said housing
    wherein at least a part of said housing is made of a biodegradable material containing polylactic acid as a major component thereof, and
    wherein the biodegradable material containing polylactic acid as a major component is a mixture of polylactic acid and one or more other components, where a weight % of said other components does not exceed 50% of the total weight of the mixture.

2. The handheld remote of claim 1, wherein
    said other components comprise one or more materials arbitrarily selected from a group consisting of biodegradable organic compounds other than polylactic acid and inorganic compounds.

3. The handheld remote of claim 2, wherein
    said organic compound other than polylactic acid is a single or a plurality of materials arbitrarily selected from a group consisting of polybutylene succinate, polycaprolactone, aliphatic polyester, cellulose acetate-base biodegradable resin, polyvinyl alcohol and natural organic substances.

4. A handheld remote comprising a housing and circuitry configured for wireless communication within said housing,
    wherein at least a part of said housing is made of a biodegradable material containing polylactic acid as a major component thereof, and
    wherein said housing is at least semi-transparent.

5. A handheld remote comprising a housing and circuitry configured for wireless communication within said housing,
    wherein at least a part of said housing is made of a biodegradable material containing polylactic acid as a major component thereof, and
    wherein said housing is transparent.

* * * * *